(12) United States Patent
Topacio et al.

(10) Patent No.: US 8,313,984 B2
(45) Date of Patent: Nov. 20, 2012

(54) DIE SUBSTRATE WITH REINFORCEMENT STRUCTURE

(75) Inventors: Roden Topacio, Markham (CA); Adam Zbrzezny, Scarborough (CA)

(73) Assignee: ATI Technologies ULC, Markham (CA)

( * ) Notice: Subject to any disclaimer, the term of this patent is extended or adjusted under 35 U.S.C. 154(b) by 706 days.

(21) Appl. No.: 12/051,330

(22) Filed: Mar. 19, 2008

(65) Prior Publication Data

US 2009/0236730 A1 Sep. 24, 2009

(51) Int. Cl.
*H01L 21/00* (2006.01)
*H01L 21/44* (2006.01)

(52) U.S. Cl. .. 438/125; 438/126; 438/613; 257/E21.505

(58) Field of Classification Search ............... 438/125, 438/126, 613; 257/E21.505
See application file for complete search history.

(56) References Cited

U.S. PATENT DOCUMENTS

| | | | |
|---|---|---|---|
| 5,866,943 A | | 2/1999 | Mertol |
| 6,011,697 A * | | 1/2000 | Budnaitis et al. ............. 361/792 |
| 6,020,221 A * | | 2/2000 | Lim et al. ...................... 438/125 |
| 6,046,077 A | | 4/2000 | Baba |
| 6,051,888 A | | 4/2000 | Dahl |
| 6,114,048 A | | 9/2000 | Jech et al. |
| 6,114,763 A | | 9/2000 | Smith |
| 6,224,711 B1 | | 5/2001 | Carden |
| 6,313,521 B1 | | 11/2001 | Baba |
| 6,317,333 B1 | | 11/2001 | Baba |
| 6,444,497 B2 * | | 9/2002 | Wensel et al. ................ 438/124 |
| 6,445,062 B1 | | 9/2002 | Honda |
| 6,459,144 B1 * | | 10/2002 | Pu et al. ........................ 257/667 |
| 6,509,630 B1 | | 1/2003 | Yanagisawa |
| 6,514,847 B1 * | | 2/2003 | Ohsawa et al. ............... 438/614 |
| 6,562,662 B2 * | | 5/2003 | Shishido et al. .............. 438/125 |
| 6,703,704 B1 | | 3/2004 | Alcoe et al. |
| 6,756,685 B2 | | 6/2004 | Tao |
| 6,944,945 B1 | | 9/2005 | Shipley et al. |
| 6,949,404 B1 | | 9/2005 | Fritz et al. |
| 6,979,636 B1 | | 12/2005 | Lin et al. |
| 7,102,228 B2 | | 9/2006 | Kanda |
| 7,196,426 B2 | | 3/2007 | Nakamura et al. |
| 7,271,480 B2 * | | 9/2007 | Chang et al. .................. 257/710 |
| 7,563,651 B2 * | | 7/2009 | Kawata ......................... 438/125 |
| 2001/0017408 A1 | | 8/2001 | Baba |
| 2002/0114144 A1 | | 8/2002 | Kumamoto et al. |

(Continued)

FOREIGN PATENT DOCUMENTS

JP          9283889          10/1997
(Continued)

OTHER PUBLICATIONS

USPTO Office Action notification date Aug. 17, 2009; U.S. Appl. No. 11/748,618.

(Continued)

*Primary Examiner* — David Zarneke
(74) *Attorney, Agent, or Firm* — Timothy M. Honeycutt

(57) ABSTRACT

Various semiconductor chip package substrates with reinforcement and methods of making the same are disclosed. In one aspect, a method of manufacturing is provided that includes providing a package substrate that has a first side and a second side opposite to the first side. The first side has a central area adapted to receive a semiconductor chip. A solder reinforcement structure is formed on the first side of the package substrate outside of the central area to resist bending of the package substrate.

18 Claims, 9 Drawing Sheets

U.S. PATENT DOCUMENTS

| | | | |
|---|---|---|---|
| 2003/0025180 | A1 | 2/2003 | Alcoe et al. |
| 2003/0178722 | A1 | 9/2003 | Xie et al. |
| 2004/0099958 | A1 | 5/2004 | Schildgen et al. |
| 2004/0150118 | A1 | 8/2004 | Honda |
| 2005/0230797 | A1 | 10/2005 | Ho et al. |
| 2005/0282310 | A1 | 12/2005 | Zhou |
| 2006/0208356 | A1 | 9/2006 | Yamano et al. |
| 2006/0249852 | A1 | 11/2006 | Chiu et al. |
| 2008/0001308 | A1 | 1/2008 | Chen |
| 2008/0054490 | A1 | 3/2008 | McLellan et al. |
| 2008/0142996 | A1 | 6/2008 | Subramanian et al. |
| 2008/0272482 | A1 | 11/2008 | Jensen et al. |

FOREIGN PATENT DOCUMENTS

| | | |
|---|---|---|
| JP | 3161706 | 8/2000 |
| JP | 3180794 | 4/2001 |
| JP | 3189270 | 5/2001 |
| JP | 3219043 | 8/2001 |
| JP | 3228339 | 9/2001 |
| JP | 2002190560 | 7/2002 |
| JP | 3367554 | 11/2002 |
| JP | 3384359 | 12/2002 |
| JP | 3385533 | 1/2003 |
| JP | 2003051568 | 2/2003 |
| JP | 3459804 | 8/2003 |
| JP | 2004260138 | 9/2004 |
| JP | 200767010 | 3/2007 |

OTHER PUBLICATIONS

Lisa Kosanovic; *New Wires for Old*; http://www.memagazine.org/supparch/pejun04/newwires/newwires.html; Mechanical Engineering "Power & Energy,"; Jun. 2004; pp. 1-5.

Wikipedia; *Invar*; http://en.wikipedia.org/wiki/Invar; unknown date; pp. 1-2.

*Invar*; http://asuwlink.uwyo.edu/-metal/invar.html; Aug. 11, 2007; pp. 1-3.

USPTO Notice of Allowance mailed Dec. 13, 2010; U.S. Appl. No. 12/198,227.

USPTO Office Action notification date Sep. 7, 2011; U.S. Appl. No. 12/435,147.

USPTO Office Action mailed Mar. 27, 2009; U.S. Appl. No. 11/748,618.

U.S. Appl. No. 12/435,147, filed May 4, 2009, Stephen Heng et al.

U.S. Appl. No. 11/748,618, filed May 15, 2007, Eric Tosaya.

U.S. Appl. No. 12/029,305, filed Feb. 11, 2008, Eric Tosaya.

Horatio Quinones et al.; *Flip Chip Encapsulation Reliability*; ASYMTEK; Aug. 1998; pp. 1-13.

Richard Blish, Ph.D.; *Use Condition Based Reliability Evaluation of New Semiconductor Technologies*; SEMATECH; Aug. 31, 1999; pp. 1-24.

National Electronics Center of Excellence; *Empfasis-Lead Free Soldering for Sustainment*; A publication of the National Electronics Manufacturing Center for Excellence; http://www.empf.org/empfasis/oct03/3403pbsustain.htm; Mar./Apr. 2003; pp. 1-3.

K.C. Norris et al.; *Reliability of Controlled Collapse Interconnections*; IBM J. Res. Development; May 1969; pp. 1-6.

Werner Engelmaier; *Solder Joints in Electronics: Design for Reliability*; 1999; pp. 1-13.

USPTO Office Action notification date Jul. 29, 2010; U.S. Appl. No. 12/198,227.

PCT/IB2009/000561 International Search Report.

U.S. Appl. No. 12/198,227, filed Aug. 26, 2008, Mohammad Khan et al.

* cited by examiner

DIE SUBSTRATE WITH REINFORCEMENT STRUCTURE

BACKGROUND OF THE INVENTION

1. Field of the Invention

This invention relates generally to semiconductor processing, and more particularly to semiconductor chip package substrates and methods of making the same.

2. Description of the Related Art

Many current integrated circuits are formed as multiple dice on a common silicon wafer. After the basic process steps to form the circuits on the dice are complete, the individual dice are cut from the wafer. The cut dice are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a material that prevents damage to the solder bumps due to mismatches in the coefficients of thermal expansion between the die and the substrate, and an adhesive to hold the die. The substrate interconnects include an array of solder pads that are arranged to line up with the die solder bumps. After the die is seated on the substrate, a reflow process is performed to enable the solder bumps of the die to metallurgically bond to the solder pads of the substrate.

One conventional type of substrate consists of a core laminated between upper and lower build-up layers. The core itself usually consists of four layers of glass filled epoxy. The build-up layers, which may number four or more on opposite sides of the core, are formed from some type of resin. Various metallization structures are interspersed in the core and build-up layers in order to provide electrical pathways between pins, pads or other solder balls on the lowermost layer of the substrate and the pads that bond with the chip solder bumps. The pins, pads or solder balls are designed to electrically interface with a pin grid array socket, a land grid array socket or a ball grid array land pattern of another electrical device, such as a printed circuit board.

The core provides a certain stiffness to the substrate. Even with that provided stiffness, conventional substrates still tend to warp due to mismatches in coefficients of thermal expansion for the chip, underfill and substrate. However, there is a need to provide shorter electrical pathways in package substrates in order to lower power supply inductance and improve power fidelity for power transferred through the substrate. The difficult problem is how to reduce the electrical pathways without inducing potentially damaging substrate warping.

One conventional technique for shoring up the stiffness of a chip package substrate involves the mounting of a stiffener ring to an upper side of the package substrate. These types of conventional stiffeners are frequently fabricated from copper, aluminum or steel and require an adhesive to adhere to the substrate.

The present invention is directed to overcoming or reducing the effects of one or more of the foregoing disadvantages.

SUMMARY OF THE INVENTION

In accordance with one aspect of the present invention, a method of manufacturing is provided that includes providing a package substrate that has a first side and a second side opposite to the first side. The first side has a central area adapted to receive a semiconductor chip. A solder reinforcement structure is formed on the first side of the package substrate outside of the central area to resist bending of the package substrate.

In accordance with another aspect of the present invention, a method of manufacturing is provided that includes providing a package substrate that has a first side and a second side opposite to the first side. The first side has a central area adapted to receive a semiconductor chip. A solder-wettable surface is formed on the first side outside the central area. A solder mask is formed on the first side of the package substrate while leaving at least a portion of the solder-wettable surface exposed. Solder is deposited on the solder-wettable surface to form a reinforcement structure on the first side of the package substrate to resist bending of the package substrate.

In accordance with another aspect of the present invention, an apparatus is provided that includes a package substrate that has a first side and a second side opposite to the first side. The first side has a central area adapted to receive a semiconductor chip. A solder reinforcement structure is on the first side of the package substrate outside of the central area to resist bending of the package substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
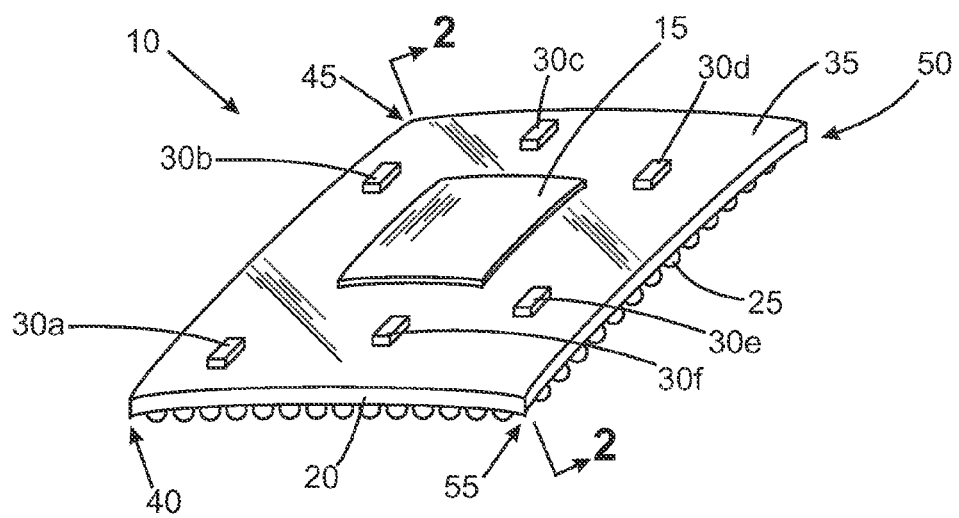
FIG. 1 is a pictorial view of an exemplary conventional semiconductor chip package that includes a semiconductor chip mounted on a substrate.

In the drawings described below, reference numerals are generally repeated where identical elements appear in more than one figure. Turning now to the drawings, and in particular to FIG. 1, therein is shown a pictorial view of an exemplary conventional semiconductor chip package 10 that includes a semiconductor chip 15 mounted on a substrate 20. The substrate 20 is depicted as a ball grid array and thus includes a plurality of solder balls 25 that are destined for metallurgical connection to a printed circuit board (not shown). A few passive devices 30a, 30b, 30c, 30d, 30e and 30f, such as capacitors, are depicted on an upper surface 35 of the substrate 20. The chip 15 is flip-chip mounted to the substrate 20 and electrically connected thereto by way of a plurality of solder bumps which are not visible in FIG. 1, but will be in subsequent figures.

Figure 2:
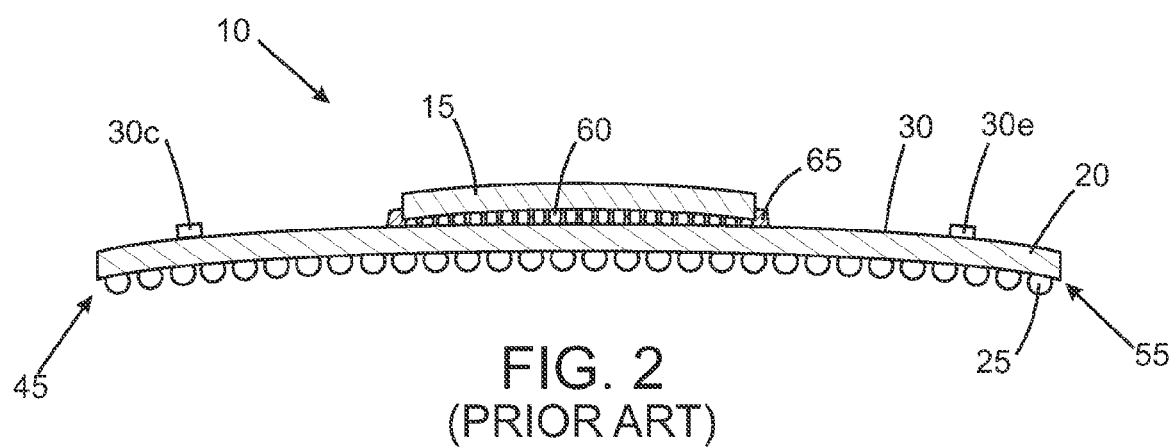
FIG. 2 is a sectional view of FIG. 1 taken at section 2-2.

Note that FIG. 1 depicts a problem that may arise with conventional semiconductor chip package substrates, namely, the downward bending or warping of the substrate 20 and in particular at the corners 40, 45, 50 and 55 thereof. The physical mechanisms that lead to such downward warping will be described in conjunction with subsequent figures. Attention is now turned to FIG. 2, which is a sectional view of the chip package 10 of FIG. 1 taken at section 2-2. Note that because of the location of section 2-2, only the passive devices 30c and 30e and the corners 45 and 55 of the substrate 20 are visible in FIG. 2. As mentioned briefly above, the semiconductor chip 15 is electrically and mechanically connected to the substrate 20 by way of a plurality of solder bumps 60. The bumps 60 are electrically connected to the balls 25 of the substrate 20 by conductors incorporated into the substrate 20 that are not visible. An underfill material layer 65 is deposited beneath the chip 15 and on the upper surface 30 of the substrate 20 to address issues of differing coefficients of thermal expansion between the chip 15 and the substrate 20. Much of the warpage of the substrate 20 and in particular at the corners 45 and 55 thereof, is caused by the mechanical forces imposed on the substrate 20 at the time that the solder bumps 60 beneath the chip 15 are reflowed and the underfill material layer 65 is thermally cured.

Figure 3:
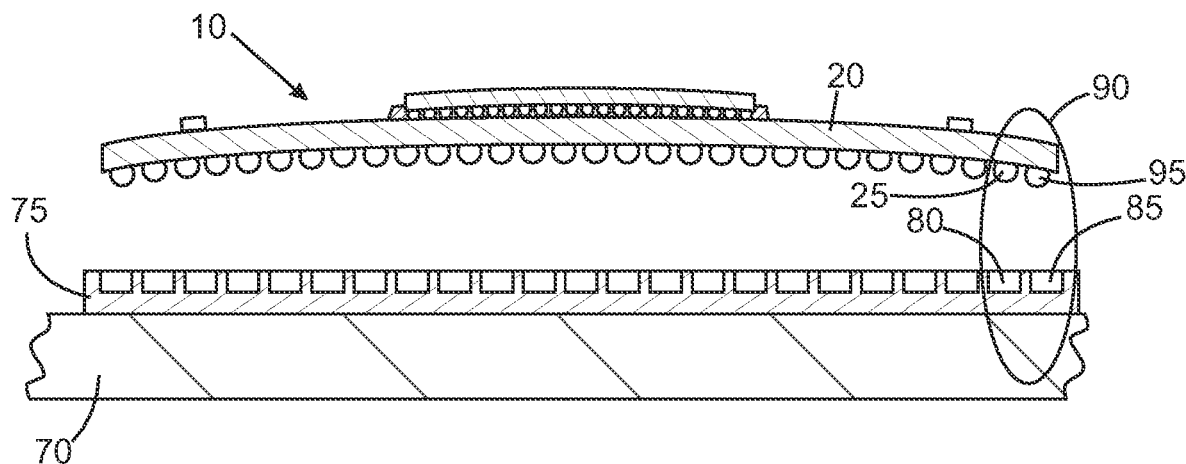
FIG. 3 is a sectional view like FIG. 2 depicting a mounting of the conventional semiconductor chip package to a printed circuit board.

Product yield issues that may arise as a result of the warpage of the substrate 20 can come into play when it is time to mount the substrate 20 and in particular the solder balls 25 thereof to another structure such as a printed circuit board land pattern. Attention is now turned to FIG. 3, which is a sectional view like FIG. 2, but depicts the semiconductor chip package 10 positioned slightly above a printed circuit board 70 that includes an upwardly facing land pattern 75. During the mounting procedure, the substrate 20 is seated on the land pattern 75 such that the solder balls 25 of the substrate contact corresponding ball pads of the land pattern 75, two of which are labeled 80 and 85. A reflow process is then performed to establish metallurgical connections between the balls 25 and the pads 80 and 85.

The warping of the substrate 20 can cause a variety of spatial misalignments associated with the balls 25 and the pads 80 and 85 that can lead to poor mounting outcomes. The effects can be better visualized by focusing on a small portion of the package 10 circumscribed by the oval 90. One of the solder balls within the oval 90 is separately labeled 95. The portion circumscribed by the oval 90 is shown at greater magnification in FIG. 4.

Figure 4:
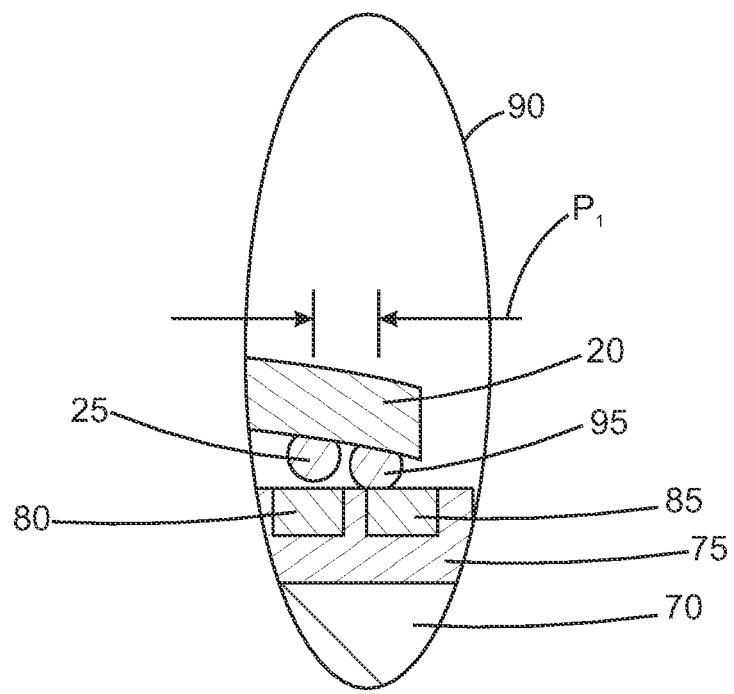
FIG. 4 is a magnified view of a small portion of FIG. 3.

Attention is now turned to FIG. 4. Note that a small portion of the land pattern 75 and the underlying printed circuit board 70 are visible as well as the ball pads 80 and 85 and the solder balls 25 and 95 of the substrate 20. Several potential undesirable outcomes are depicted. To begin with, the lateral alignment between the solder ball 95 and the underlying target ball pad 85 is misaligned as a result of the warping of the substrate 20. The warping has also caused the pitch $P_1$ between the solder balls 25 and 95 to be smaller than a design pitch between the balls 25 and 95 if the substrate 20 were not warped. The fallout of this smaller than desired ball pitch will be depicted and described in conjunction with the next figure. In addition, the ball 25 of the substrate 20 may be elevated above the respective target ball pad 80, which may or may not lead to adhesion problems during a subsequent reflow of the solder balls 25 and 95.

Figure 5:
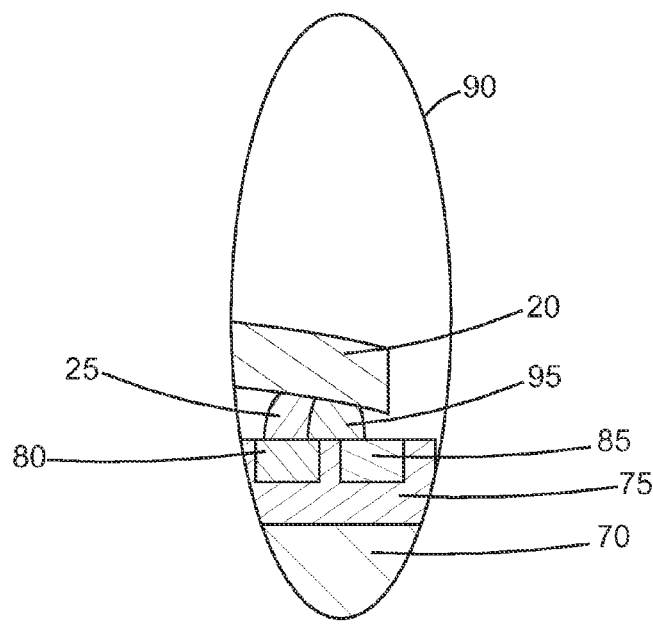
FIG. 5 is a magnified view like FIG. 4 depicting the aftermath of a solder reflow.

FIG. 5 is a magnified sectional view like FIG. 4, but depicts the aftermath of a solder reflow process to establish metallurgical connections between the solder balls 25 and 95 and the underlying target ball pads 80 and 85 of the land pattern 75. Because the pre-reflow pitch $P_1$ (see FIG. 4) is smaller than planned due to the warping of the substrate 20, the balls 25 and 95 have merged during reflow to produce a highly undesirable and yield limiting short circuit situation. Whether the substrate 20 can be subsequently lifted from the printed circuit board 70 and successfully refurbished or must be consigned to scrap is an open question.

Figure 6:
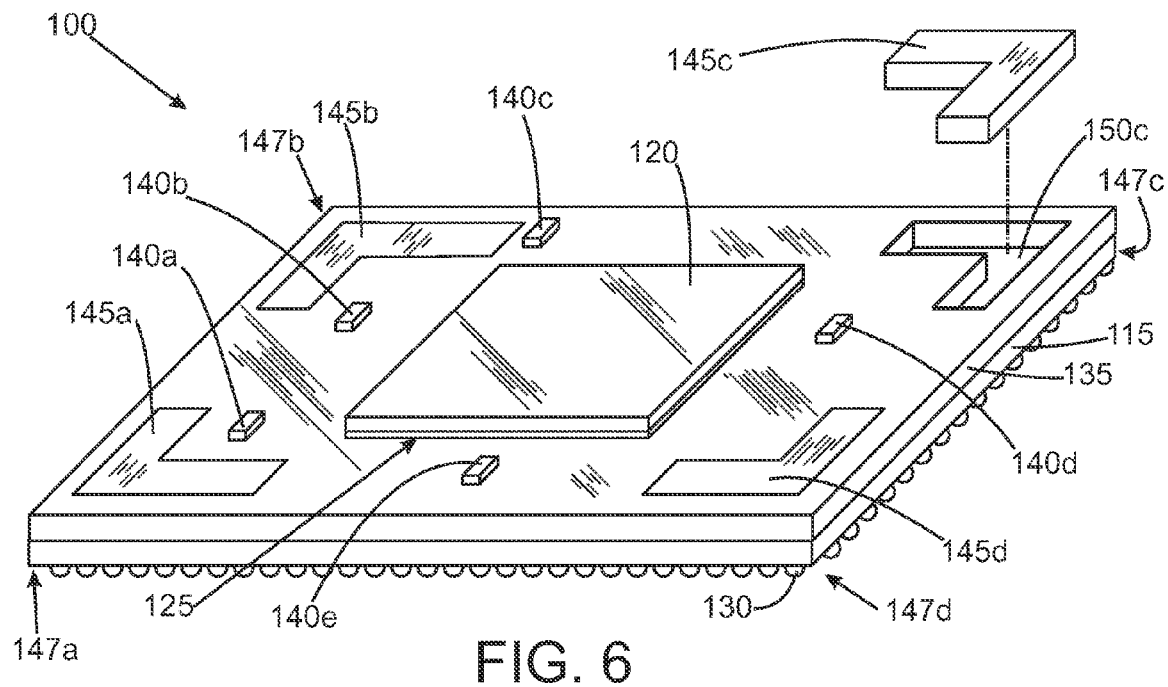
FIG. 6 is a pictorial view of an exemplary embodiment of a semiconductor chip package that includes a substrate reinforcement structure.

FIG. 6 depicts a pictorial view of an exemplary embodiment of a semiconductor chip package 100 that alleviates some of the deficiencies of the aforementioned conventional semiconductor chip package 10. The package 100 includes a substrate 115 designed to have a semiconductor chip or die 120 mounted thereon or multiple chips if desired. The chip 120 may be any of a myriad of different types of circuit devices used in electronics, such as, for example, microprocessors, graphics processors, combined microprocessor/graphics processors, application specific integrated circuits, memory devices or the like, and may be single or multi-core. An underfill material layer 125 may be positioned beneath the chip 120 to lessen the effects of differential coefficients of thermal expansion between the chip 120 and the substrate 115.

The substrate 115 may consist of a core/build-up configuration. In this regard, the substrate 115 may consist of a central core upon which one or more build-up layers are formed and below which an additional one or more build-up layers are formed. The core itself may consist of a stack of one or more layers. One example of such an arrangement may be termed a so called "2-4-2" arrangement where a four-layer core laminated between two sets of two build-up layers. The number of layers in the substrate 115 can vary from four to sixteen or more, although less than four may be used. So-called "coreless" designs may be used as well. The layers of the substrate 115 consist of an insulating material, such as various well-known epoxies, interspersed with metal interconnects.

To interface with other electronic devices, the substrate 115 may be configured as a ball grid array as shown or some other type of substrate interconnection scheme. A plurality of solder balls 130 are coupled to the substrate 115. The semiconductor chip 120 may be flip-chip mounted to the substrate 115. A plurality of electrical interconnects are not visible but are incorporated into the substrate 115 in order to establish electrical interconnections between the chip 120 and the plurality of solder balls 130.

Note that a solder mask 135 is formed on an upper surface of the substrate 115. A plurality of passive devices, which may be capacitors, inductors or other electronic components, are mounted to the solder mask 135 with solder structures that are not visible due to the scale of FIG. 6, but will be visible in subsequent figures. Just a few of the passive devices are shown and labeled 140a, 140b, 140c, 140d and 140e, respectively. Like the chip 120, the passive devices 140a, 140b, 140c, 140d and 140e are electrically interconnected with other components of the package 100 by way of a plurality of conductors which are not visible in FIG. 6. To counteract the potential for substrate warpage, such as that depicted in FIGS. 1-5, the substrate 115 of this exemplary embodiment is provided with a reinforcement structure that consists of four reinforcement members 145a, 145b, 145c and 145d designed to resist the downward warping of the corners 147a, 147b, 147c and 147d of the substrate 115. Note that the reinforcement member 145c is shown exploded from the solder mask 135 to reveal its structure. The reinforcement member 145c is metallurgically connected to an underlying solder-wettable surface that consists of a conductor pad 150c that is formed in the substrate 115 in this embodiment. Similar pads that make up the remainder of the solder-wettable surface are positioned in the substrate 115 beneath the reinforcement members 145a, 145b and 145d but are not visible in FIG. 6.

In this illustrative embodiment, the reinforcement members 145a, 145b, 145c and 145d are patterned as elbow-shaped members. The reinforcement members 145a, 145b, 145c and 145d are advantageously composed of solder that may be the same type of solder used to fabricate other structures in the substrate 115 as described more fully below. In this way, the reinforcement members 145a, 145b, 145c and 145d may be fabricated without the requirement of additional process steps or the provision of separate reinforcement rings of the type described in the Background section hereof.

Figure 7:
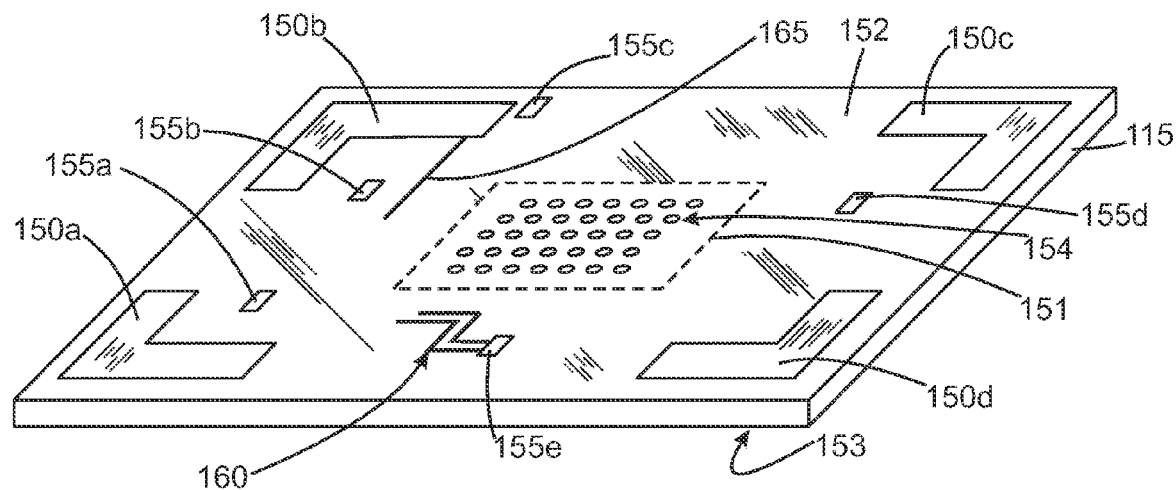
FIG. 7 is a pictorial view of an exemplary package substrate prior to solder mask formation.

An exemplary method of fabricating the reinforcement members 145a, 145b, 145c and 145d depicted in FIG. 6 may be understood by referring now to FIGS. 7, 8, 9, 10 and 11 and initially to FIG. 7, which is a pictorial view of the substrate 115 prior to application of the solder mask 135 (see FIG. 6) thereto. The conductor pad 150c that was partially obscured by the solder mask 135 in FIG. 6 is now visible along with three other conductor pads 150a, 150b and 150d. The conductor pads 150a, 150b, 150c and 150d are positioned outside of a central area 151 of a side 152 of the substrate 115. An opposite side 153 of the substrate 115 is designed to receive the solder balls 130 depicted in FIG. 6. The central area 151 includes an array 154 of bump pads that are designed to be electrically connected to the semiconductor chip 120 shown in FIG. 6 during subsequent processing. The conductor pad 150c and three other conductor pads 150a, 150b and 150d are slated to receive the reinforcement members 145a, 145b, 145c and 145d depicted in FIG. 6. In addition, the substrate 115 includes component pads 155a, 155b, 155c, 155d and 155e that are designed to electrically connect to the passive devices 140a, 140b, 140c, 140d and 140e depicted in FIG. 6 by way of solder portions that fill various openings in the solder mask 135 depicted in FIG. 6. As noted above, there are a plurality of interconnects in the substrate 115 that connect various elements electrically. A few of these interconnects or traces 160 are depicted connected to the component pad 155e and one such trace 165 is depicted connected to the conductor pad 150b. However, just a few of the conductor traces are depicted for simplicity of illustration. The skilled artisan will appreciate that there may be large numbers of such conductors in the substrate 115 including in various layers thereof. The various traces 160 and 165 may be tied to ground, or some other potential level.

The conductor pads 150a, 150b, 150c and 150d are fabricated on the substrate 115 with preselected shapes or patterns that are designed to match the desired shapes for the subsequently formed reinforcement members (145a, 145b, 145c and 145d in FIG. 6). Well-known techniques for forming conductor pads on chip substrates may be used such as electroplating or other plating techniques and followed by lithographic masking and well-known etch processes. The same material deposition and lithographic patterning and etching process may be done to fabricate the component pads 155a, 155b, 155c, 155d and 155e as well. Exemplary materials for the pads 150a, 150b, 150c and 150d and 155a, 155b, 155c, 155d and 155e include copper, silver, gold, platinum, palladium, combinations of these or the like.

Figure 8:
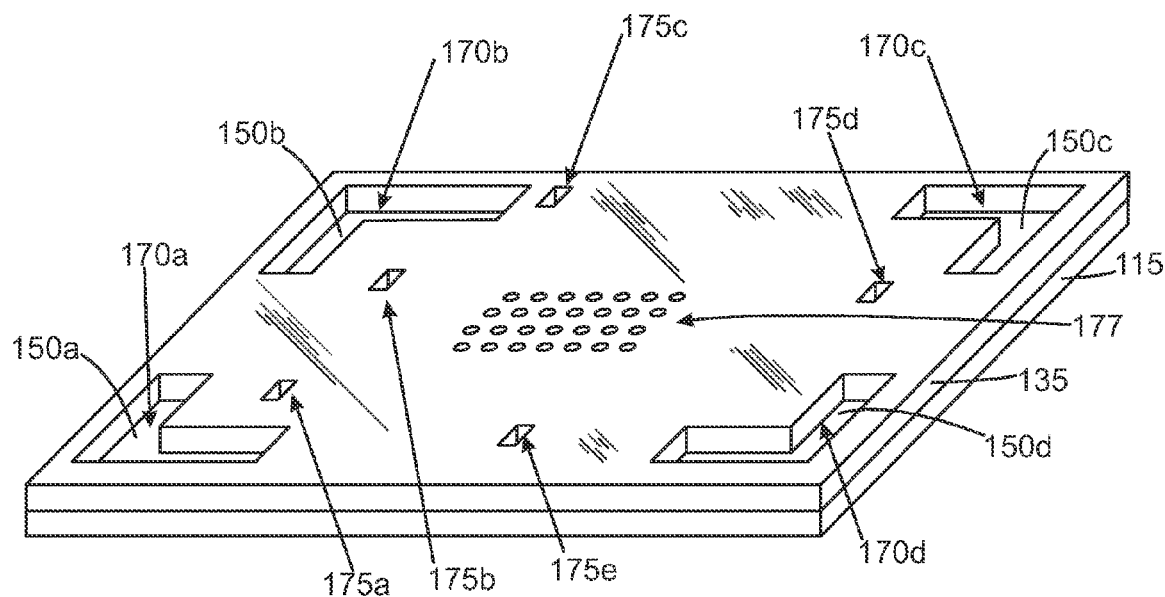
FIG. 8 is a pictorial view of the substrate of FIG. 7 following solder mask formation.

As shown in FIG. 8, the solder mask 135 is formed on the substrate 115 and provided with a plurality of openings 170a, 170b, 170c and 170d that correspond to the desired positions and shapes of the subsequently formed reinforcement members 145a, 145b, 145c and 145d shown in FIG. 6. In addition, the solder mask 135 is provided with openings 175a, 175b, 175c, 175d and 175e proximate the positions of the underlying component pads 155a, 155b, 155c, 155d and 155e shown in FIG. 7. Finally, an array 177 of openings is provided in vertical alignment with the array 154 of bump pads shown in FIG. 7. The array 177 of openings is filled with solder that will bond with the semiconductor chip 120 shown in FIG. 6 during subsequent processing. The solder mask 135 may be fabricated from a variety of suitable materials for solder mask fabrication, such as, for example, PSR-4000 AUS703 manufactured by Taiyo Ink Mfg. Co., Ltd. or SR7000 manufactured by Hitachi Chemical Co., Ltd. The openings 170a, 170b, 170c and 170d, 175a, 175b, 175c, 175d and 175e and the array 177 of openings may be formed by well-known lithographic masking and etching. As is evident from FIG. 8, the openings 170a, 170b, 170c and 170d are etched down to the underlying solder-wettable surface consisting of the conductor pads 150a, 150b, 150c and 150d. In order to properly wet, at least some of the pads 150a, 150b, 150c and 150d must be exposed. With the openings 170a, 170b, 170c and 170d and 175a, 175b, 175c, 175d and 175e formed, the solder mask 135 is ready for solder deposition.

Figure 9:
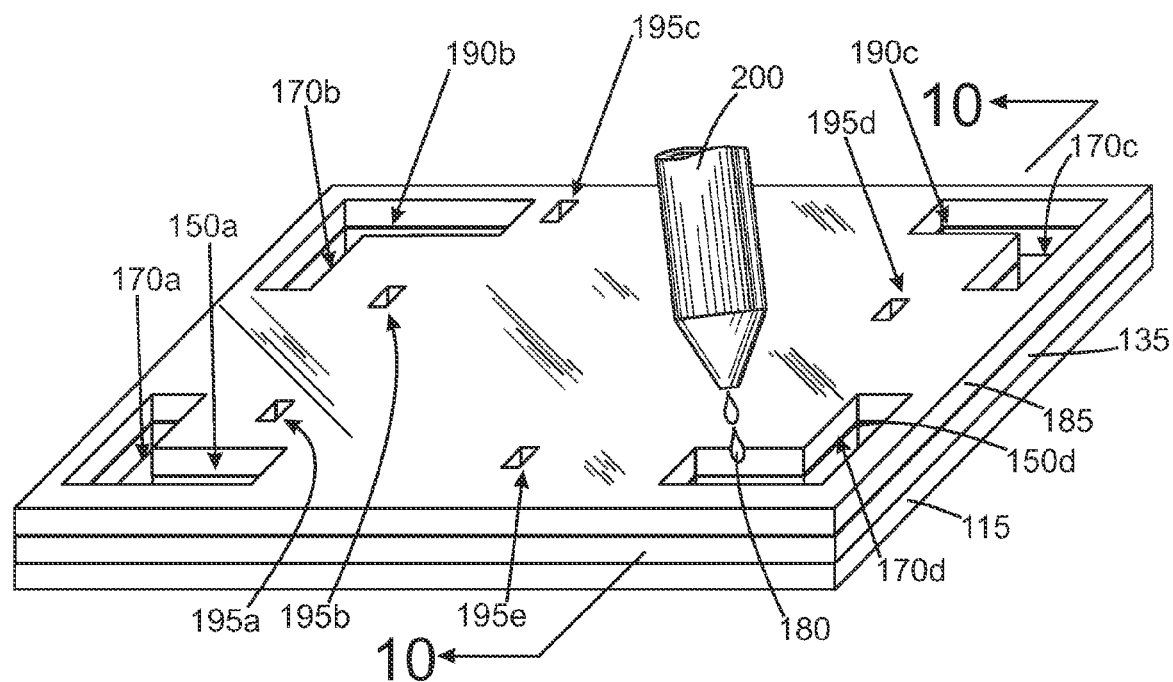
FIG. 9 is a pictorial view like FIG. 8 depicting solder application.

Attention is now turned to FIG. 9, which depicts the application of solder 180 through a stencil 185 that is patterned with a plurality of openings 190a, 190b, 190c and 190d that are designed to match the size and shape and position of the underlying openings 170a, 170b, 170c and 170d and another plurality of openings 195a, 195b, 195c, 195d and 195e that are designed to match the size and shape and position of the underlying openings 175a, 175b, 175c, 175d and 175e (not visible in FIG. 9 but visible in FIG. 8) of the solder mask 135. The solder 180 may be deposited in paste form on the solder stencil 185 by an applicator 200 of one sort or another and the stencil 185 thereafter swiped to compress the solder 180 into the openings 190a, 190b, 190c and 190d and 195a, 195b, 195c, 195d and 195e. The stencil 185 may be composed of well-known metals, plastics or ceramics. The solder may be lead-based or lead-free. Examples of suitable lead-free solders include tin-silver, tin-copper, tin-silver-copper or the like.

Figure 10:
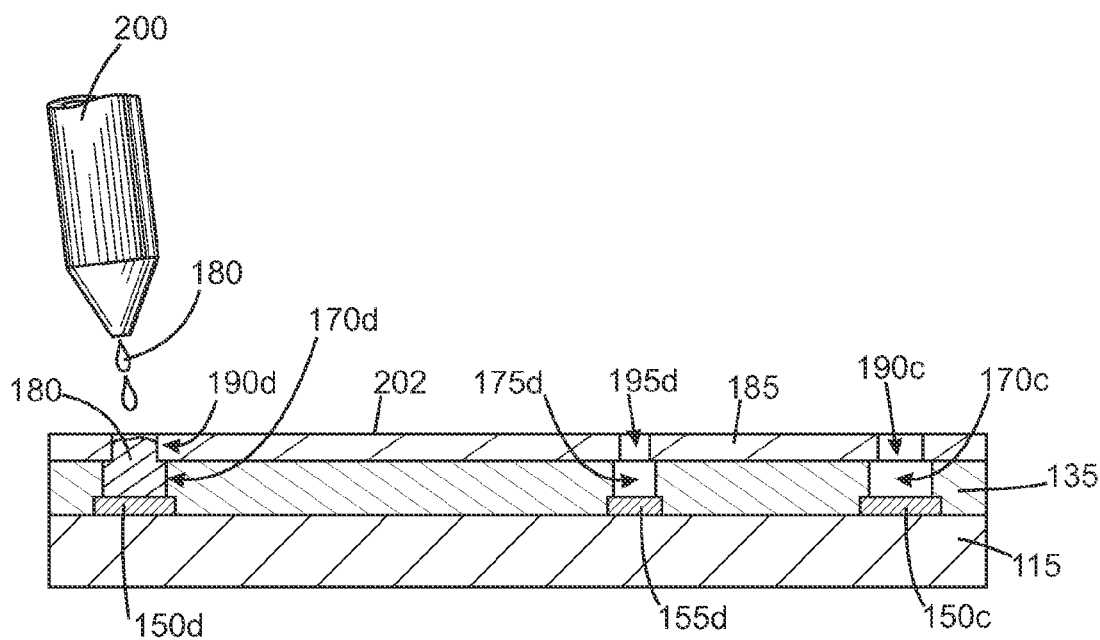
FIG. 10 is a sectional view of FIG. 9 taken at section 10-10.

The interaction of the stencil 185, the solder mask 135 and the substrate 115 during the deposition process may be understood by referring now to FIG. 10, which is a sectional view of FIG. 9 taken at section 10-10. Note that because of the location of section 10-10, a portion of the opening 190*d*, the opening 170*d* will be visible as well as the openings 195*d* and 175*d* and a portion of the openings 190*c* and 175*c* will be visible. As the solder 180 is deposited into the openings 170*d* and 190*d*, solder 180 will contact the underlying pad 150*b* and extend vertically almost to the upper surface 202 of the stencil 185. The same will be true for solder 180 deposited on the pads 155*d* and 150*a* in the remaining openings 175*d*/195*d* and 170*c*/190*c*.

Figure 11:
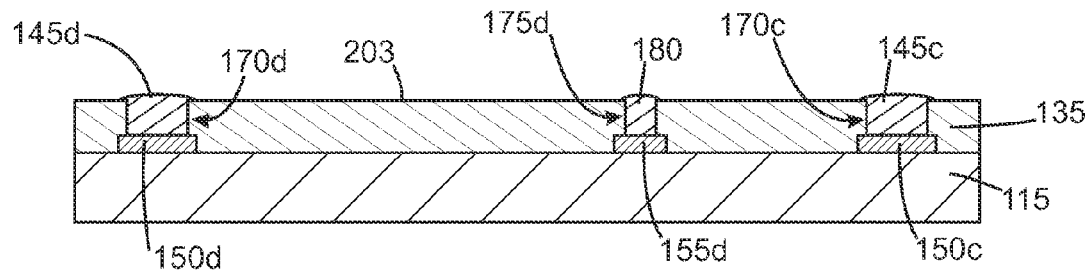
FIG. 11 is a sectional view like FIG. 10 depicting stencil removal.

After solder deposition, the stencil 185 is removed to leave the now formed solder reinforcement members 145*d* and 145*c* and a solder portion 180 projecting slightly above the solder mask 135 as shown in FIG. 11. The reinforcement member 145*d* in the opening 170*d* is in contact with the underlying conductor pad 150*d*, the portion of solder 180 in the opening 175*d* is in contact with the underlying component pad 155*d* and the reinforcement member 145*c* in the opening 170*c* is in contact with the underlying conductor pad 150*c*. At this stage, the substrate 115 and the solder mask 135 are ready for the mounting of passive devices and the semiconductor chip. Note that portions of the reinforcement members 145*c* and 145*d* extend onto an upper surface 203 of the solder mask 135. The amount of solder that extends over the surface 203 may be increased as desired by widening the openings 190*c* and 190*d* in the stencil 185 shown in FIG. 10 to allow for a greater volume of solder to be applied.

Figure 12:
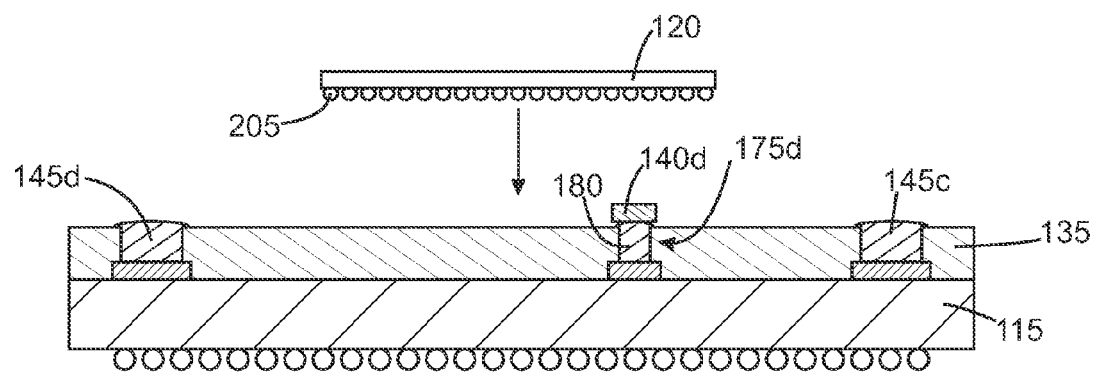
FIG. 12 is a sectional view like FIG. 11 depicting a mounting of a semiconductor chip to the substrate.

Attention is now turned to FIG. 12, which is a sectional view like FIG. 11, but shows the mounting of the passive device 140*d* to the solder 180 in the opening 175*d* of the solder mask 135. Of course it should be understood that the other passive devices 140*a*, 140*b*, 140*c* and 140*d* depicted in FIG. 6 may be mounted to the substrate 115 at this time as well. The semiconductor chip 120 may be mounted to the substrate 115 in flip-chip fashion by way of a plurality of solder bumps 205 affixed to the chip 120 and a reflow process may be performed in order to temporarily liquify the solder bumps 205 and the solder structure 180 that connects to the passive device 140*d*. The reflow process will produce a transient melting of the reinforcement members 145*d* and 145*c* (as well as the remaining reinforcement members 145*a* and 145*b* (see FIG. 6). As the substrate 115 cools to below the melting point of the reinforcement members 145*d* and 145*c* and back to room temperature, the reinforcement members 145*c* and 145*d* shown in FIGS. 6 and 12 and the members 145*a* and 145*b* shown in FIG. 6 will contract faster than the substrate 115. This contraction will have a tendency to pull the corners 147*a*, 147*b*, 147*c* and 147*d* (see FIG. 6) of the substrate 115 upward and thereby resist the downward warping depicted in FIGS. 1-5.

Figure 13:
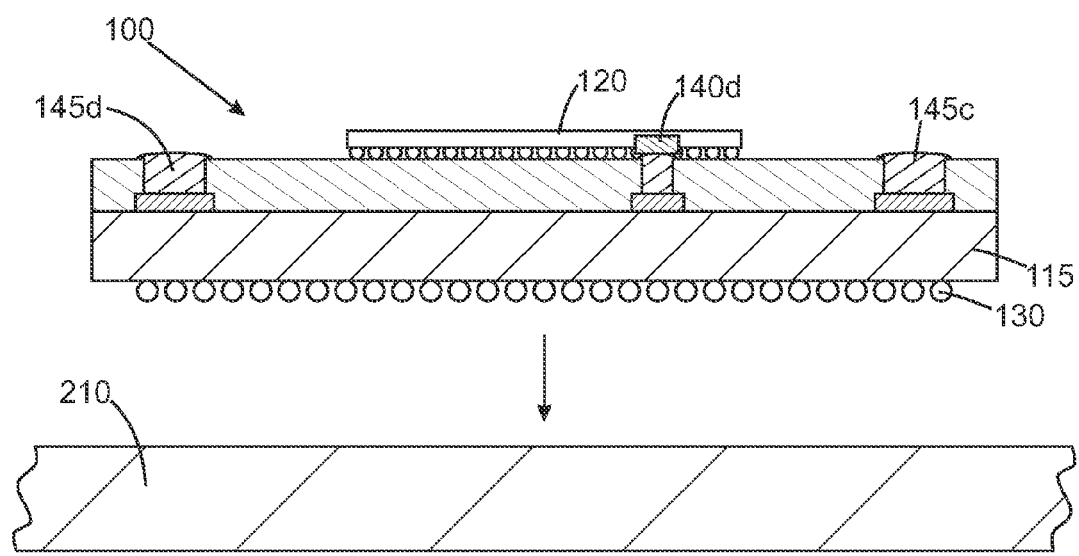
FIG. 13 is a sectional view like FIG. 12 depicting a mounting of the semiconductor chip package to a printed circuit board.

Following the reflow and cool down for the attachment of the chip 120 and the passive device 140*d*, the plural solder balls 130 may be applied to the substrate 115 as depicted in FIG. 13. At this stage, the package 100 may be mounted to a printed circuit board 210 by way of the ball grid array of solder balls 130 or other mechanism if another style of interconnect is used. Another solder reflow is performed to temporarily melt the solder balls 130. During this reflow, any room temperature warpage of the substrate 115 will tend to relax or flatten. During this thermal cycle, the reinforcement members 145*c* and 145*d* (and the members 145*a* and 145*b* shown in FIG. 6) will also melt and thus not add any warping forces to the substrate 115.

Figure 14:
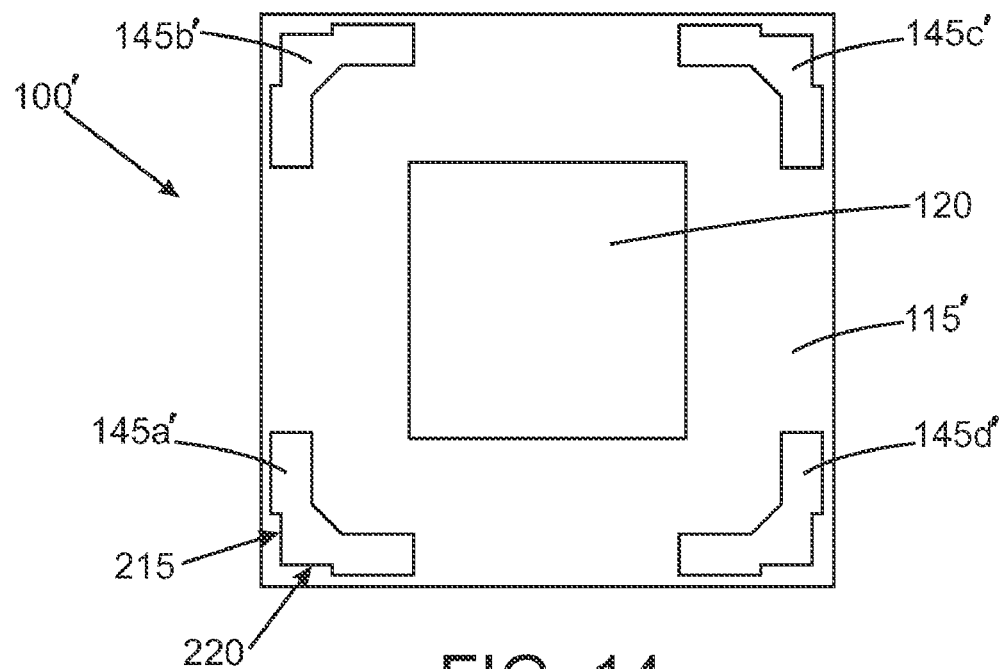
FIG. 14 is a plan view of an alternate exemplary embodiment of a semiconductor chip package substrate that includes a reinforcement member.

In the foregoing illustrative embodiment, the reinforcement structure consists of four uniform perimeter reinforcement members. However, the skilled artisan will appreciate that a variety of geometries may be used for reinforcing the substrate. FIG. 14 depicts an alternate exemplary embodiment of a semiconductor chip package 100' that includes a substrate upon which the semiconductor chip 120 is mounted and a reinforcement structure that consists of four reinforcement members 145*a*', 145*b*', 145*c*' and 145*d*'. In this illustrative embodiment, a given reinforcement member, such as the reinforcement member 145*a*' is configured generally as an elbow-like structure, albeit with a pair of cutouts 215 and 220 that are designed to expose additional portions of the corner 147*a*' of the substrate 115'. The other reinforcement members 145*b*', 145*c*' and 145*d*' may have a similar geometry as shown. The cutouts 210 and 215 provide additional space on the substrate 115' to facilitate the placement of the substrate 115' in various jigs or pick and place machines that may be useful for performing various process steps on the substrate 115'. The reinforcement members 145*b*', 145*c*' and 145*d*' may be fabricated using the same general techniques disclosed elsewhere herein. Of course, a solder-wettable surface (not visible) that is akin to the conductor pads 150*a*, 150*b*, 150*c* and 150*d* shown in FIG. 7 is provided on the substrate 115' to which the reinforcement members 145*a*', 145*b*', 145*c*' and 145*d*' bond.

Figure 15:
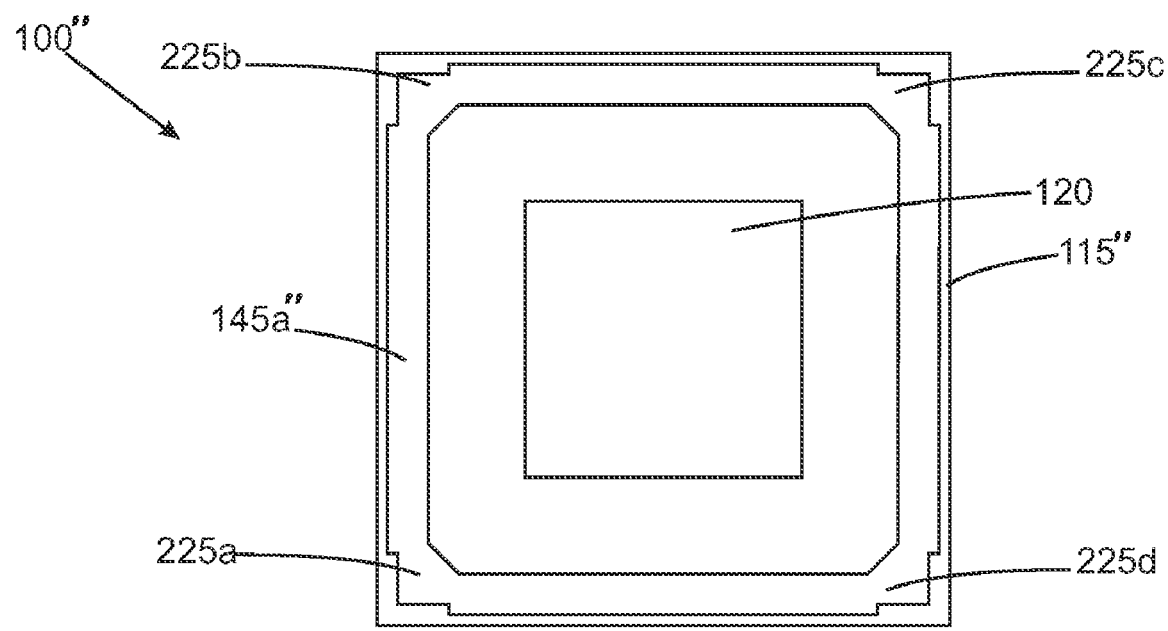
FIG. 15 is a plan view of another alternate exemplary embodiment of a semiconductor chip package substrate that includes a reinforcement member.
Figure 16:
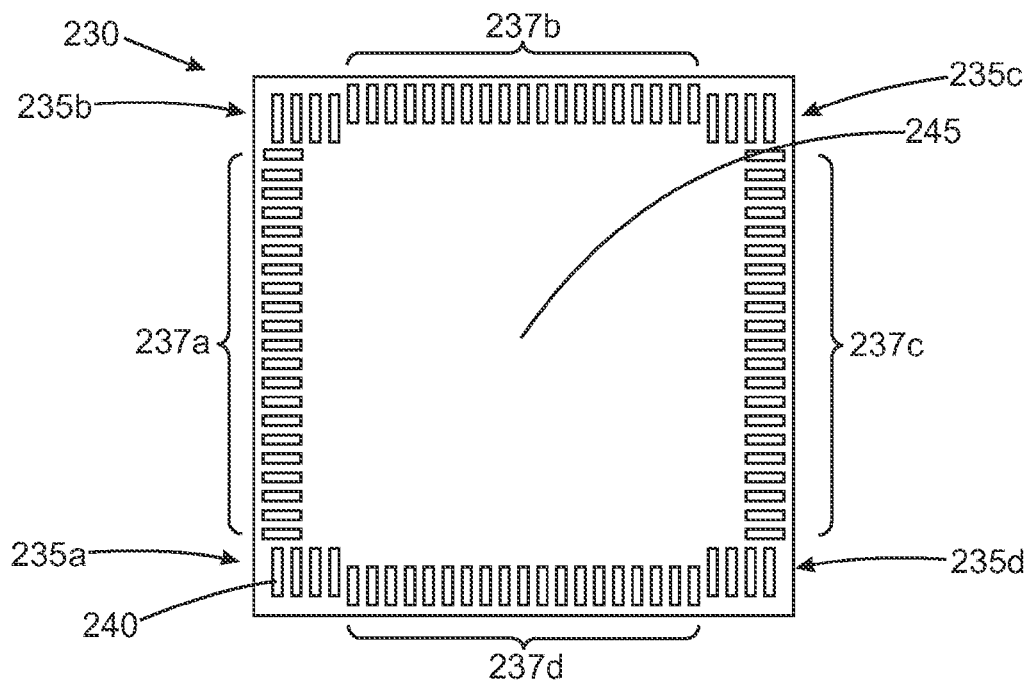
FIG. 16 is a plan view of an exemplary embodiment of a solder stencil.

Another alternate exemplary embodiment of a semiconductor chip package 100" is depicted as an overhead view in FIG. 15. In this illustrative embodiment, the package 100" includes a substrate 115" that is designed to receive the semiconductor chip 120. In this illustrative embodiment, a reinforcement structure 145*a*" consists of a reinforcement ring that may extend around the entire perimeter of the substrate 115". The respective corners 225*a*, 225*b*, 225*c* and 225*d* of the reinforcement structure 145*a*" may have cut out shapes like the reinforcement member 145*a*' depicted in FIG. 14. Of course, a solder-wettable surface (not visible) that is akin to, but perhaps more extensive than, the conductor pads 150*a*, 150*b*, 150*c* and 150*d* shown in FIG. 7 is provided on the substrate 115" to which the reinforcement member 145*a*" bonds. The reinforcement member 145*a*" may be fabricated using the same general techniques disclosed elsewhere herein. However, another type of stencil design that is suited to fashioning solder into a continuous ring may be used. A plan view of such an exemplary stencil 230 is shown in FIG. 16. The stencil 230 is provided with four sets 235*a*, 235*b*, 235*c* and 235*d* of corner slot openings and four sets 237*a*, 237*b*, 237*c* and 237*d* of edge slot openings. Each of the sets 235*a*, 235*b*, 235*c*, 235*d*, 237*a*, 237*b*, 237*c* and 237*d* includes several slots, one of which is labeled 240. During initial stenciling, solder will be pressed through and take on the shape of the sets 235*a*, 235*b*, 235*c*, 235*d*, 237*a*, 237*b*, 237*c* and 237*d* of slots 240. During a subsequent reflow, the melted solder segments will merge together to form the reinforcement member 145*a*" shown in FIG. 15. Without the slots 240, a central portion 245 of the stencil 230 would have to be supported by some other mechanism.

Figure 17:
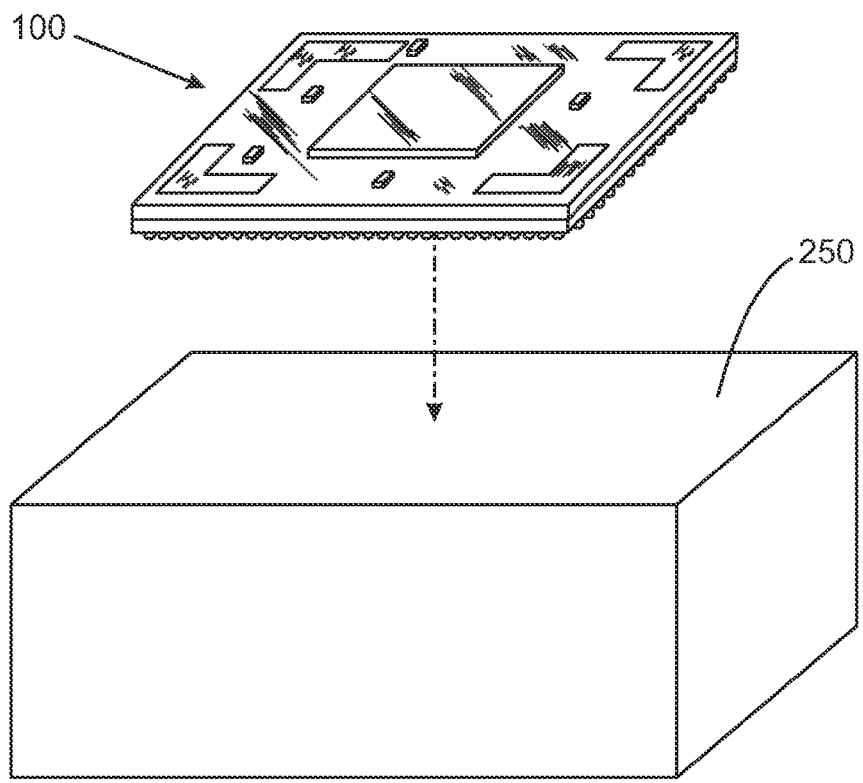
FIG. 17 is a pictorial view of an exemplary embodiment of a semiconductor chip package coupled to another electronic device.

Any of the illustrative embodiments of the chip packages disclosed herein may be mounted in another electronic device. In this regard, FIG. 17 shows an exemplary electronic device 250 that may be a computer, a digital television, a handheld mobile device, a personal computer, a server, a memory device, an add-in board such as a graphics card, or any other computing device employing semiconductors. The semiconductor chip package 100 may be attached to the device 250 to provide a desired functionality.

Figure 18:
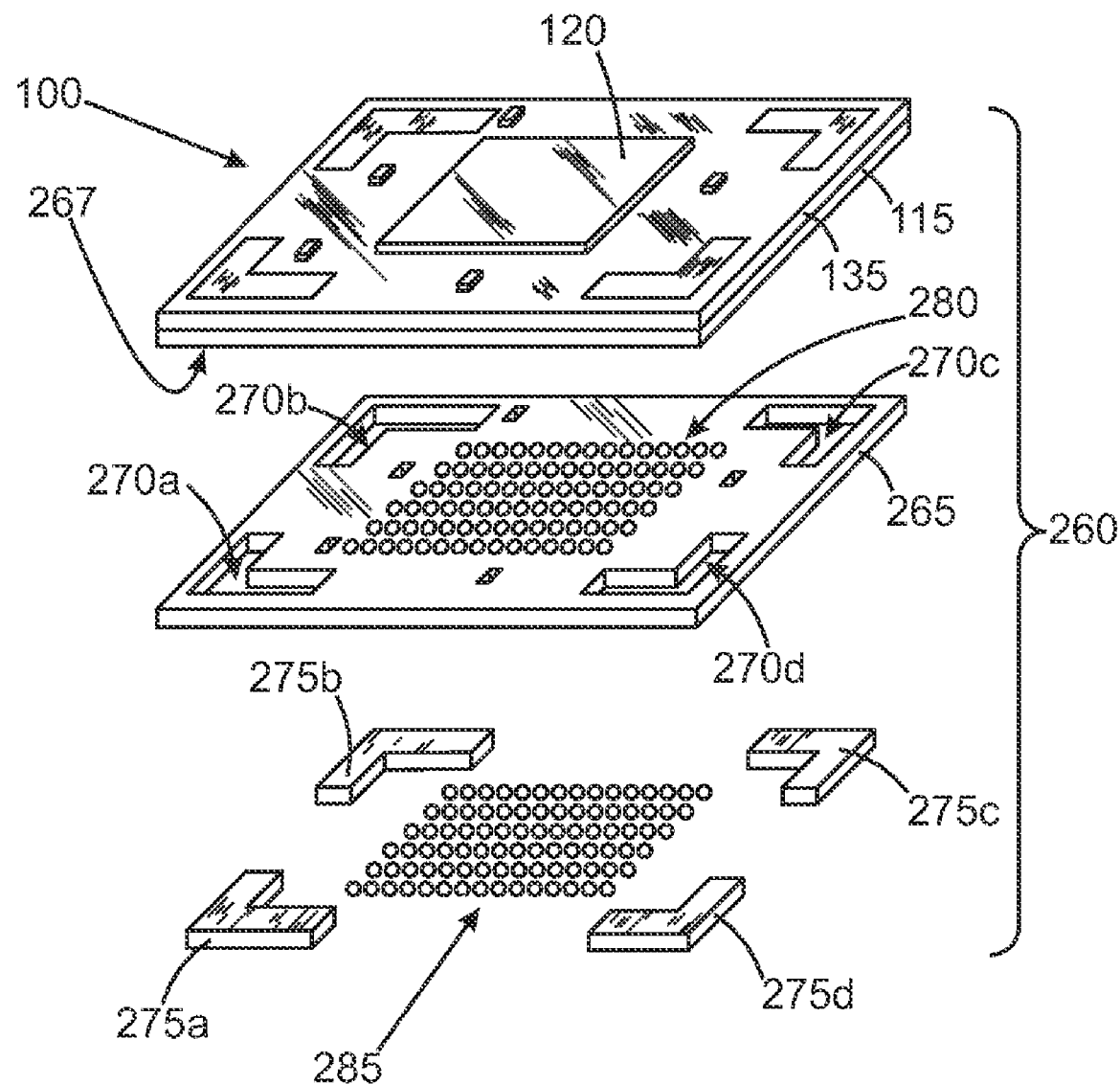
FIG. 18 is a partially exploded pictorial of another exemplary embodiment of a semiconductor chip package that includes a substrate reinforcement structure.

In the foregoing illustrative embodiments, reinforcement structures are positioned on one side of a substrate. However, the skilled artisan will appreciate that it is possible to configure a semiconductor chip package with reinforcement structures on both sides of the package substrate. In this regard, attention is now turned to FIG. 18, which is a partially exploded pictorial of a semiconductor chip package 260 that consists of the package substrate 115, and the solder mask 135 upon which a semiconductor chip 120 is positioned. The combination of the substrate 115, the solder mask 135 and the chip 120 may be configured essentially as described elsewhere herein in conjunction with the package 100. In this illustrative embodiment, a second solder mask 265 may be coupled to the under side 267 of the substrate 115. The solder mask 265 may be patterned with a set of openings 270*a*, 270*b*, 270*c* and 270*d* that are sized and spaced to receive a corresponding plurality of solder reinforcement structures 275*a*, 275*b*, 275*c* and 275*d*. The openings 270*a*, 270*b*, 270*c* and 270*d* and the solder structures 275*a*, 275*b*, 275*c* and 275*d* may be formed and materially similar to the structures that make up the solder mask 135 and the reinforcement structures 145*a*, 145*b*, 145*c* and 145*d*. The mask 265 may be provided with a grid array of openings 280 that are designed to accommodate interconnection with a ball grid array 285 that is shown exploded downward from the solder mask 265. There may be additional solder material or other conductor materials to establish electrical interconnection between the solder balls 285 and underlying conductor structures of the substrate 115 that are not visible in FIG. 18. Again, it should be understood that the shapes, number and configuration of the reinforcement structures 145*a*, 145*b*, 145*c* and 145*d* and 275*a*, 275*b*, 275*c* and 275*d* may be varied or unified as described generally herein.

Any of the exemplary embodiments disclosed herein may be embodied in instructions disposed in a computer readable medium, such as, for example, semiconductor, magnetic disk optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    providing a package substrate having a first side and a second side opposite to the first side, the first side having a central area adapted to receive a semiconductor chip; and
    forming a solder reinforcement structure on the first side of the package substrate outside of the central area to resist bending of the package substrate.

2. The method of claim 1, wherein the package substrate comprises four corners, the forming a solder reinforcement structure comprises forming a solder reinforcement member proximate each of the four corners.

3. The method of claim 1, wherein the forming a solder reinforcement structure comprises forming a solder mask on the first side of the package substrate with a plurality of openings and depositing solder into the plurality of openings.

4. The method of claim 3, comprising placing a stencil on the solder mask, depositing the solder through the stencil and removing the stencil.

5. The method of claim 1, wherein the forming a solder reinforcement structure comprises forming a solder ring.

6. The method of claim 1, comprising coupling a semiconductor chip to the first side of the package substrate.

7. The method of claim 6, comprising coupling the package substrate to an electronic device.

8. The method of claim 1, wherein the method is performed by executing instructions stored in a computer readable medium.

9. A method of manufacturing, comprising:
    applying a first portion of solder and second portion of solder to a side of a package substrate, the side having an edge and a central area adapted to receive a semiconductor chip; and
    whereby the first portion is adapted to receive a passive component and the second portion is positioned nearer the edge than the first portion and adapted to reinforce and resist bending of the package substrate.

10. The method of claim 9, comprising mounting a passive component on the first portion.

11. The method of claim 9, wherein the second portion comprises a ring.

12. The method of claim 9, wherein the applying the first and second portions of solder comprises forming a solder mask on the first side of the package substrate with a plurality of openings and depositing the first portion into at least one of the plurality of openings and the second portion into at least one of the plurality of openings.

13. The method of claim 12, comprising placing a stencil on the solder mask, depositing the first and second portions of solder in paste form through the stencil and removing the stencil.

14. A method of manufacturing, comprising:
    applying a first portion of solder and second portion of solder to a side of a package substrate, the side having four corners and a central area adapted to receive a semiconductor chip; and
    whereby the first portion is adapted to receive a passive component and the second portion includes a solder structure proximate each of the four corners, the solder structures being nearer to the corners than to the central area, the second portion adapted to reinforce and resist bending of the package substrate.

15. The method of claim 14, comprising mounting a passive component on the first portion.

16. The method of claim 14, wherein the solder structures comprises elbow structures.

17. The method of claim 14, wherein the applying the first and second portions of solder comprises forming a solder mask on the first side of the package substrate with a plurality of openings and depositing the first portion into at least one of the plurality of openings and the second portion into at least four of the plurality of openings.

18. The method of claim 17, comprising placing a stencil on the solder mask, depositing the first and second portions of solder in paste form through the stencil and removing the stencil.

* * * * *